United States Patent [19]
Bartelink

[11] Patent Number: 5,777,347
[45] Date of Patent: Jul. 7, 1998

[54] VERTICAL CMOS DIGITAL MULTI-VALUED RESTORING LOGIC DEVICE

[75] Inventor: Dirk J. Bartelink, Chapel Hill, N.C.

[73] Assignee: Hewlett-Packard Company, Palo Alto, Calif.

[21] Appl. No.: 896,895

[22] Filed: Jul. 18, 1997

Related U.S. Application Data

[63] Continuation of Ser. No. 400,223, Mar. 7, 1995, abandoned.

[51] Int. Cl.$^6$ ................................................. H01L 29/06
[52] U.S. Cl. ........................... 257/24; 257/30; 257/192; 257/329
[58] Field of Search ....................... 257/24, 25, 27, 257/192, 30, 329

[56] References Cited

U.S. PATENT DOCUMENTS

| | | | |
|---|---|---|---|
| 5,140,388 | 8/1992 | Bartelink | 357/23.4 |
| 5,198,879 | 3/1993 | Ohshima | 257/20 |
| 5,234,848 | 8/1993 | Seabaugh | 257/25 |
| 5,504,347 | 4/1996 | Jovanovic et al. | 257/25 |

OTHER PUBLICATIONS

Shoji Kawahito, Michitaka Kameyama and Tasuo Higuchi, "VLSI–Oriented Bi–Directional Current–Mode Arithmetic Circuits Based on the Radix–4 Signed–Digit Number System", IEEE Proceedings, The Sixteenth International Symposium on Multiple–Valued Logic, May 27–29, 1986, Blacksburg, Virginia, USA.

Koji Kotani, Tadashi Shibata, and Tadahiro Ohmi, "Neuron–MOS Binary–Logic Circuits Featuring Dramatic Reduction in Transistor Count and Interconnections", Proceedings of IEEE International Electron Devices Meeting, Dec. 13–16, 1992, San Francisco, CA, USA.

The National Technology Roadmap for Semiconductors, Final Draft, Oct. 19, 1994, Semiconductor Industry Association.

D. J. Bartelink and J. L. Moll, "Device Physics Perspective on Novel MOS Processes", VLSI Electronics Microstructure Science, Chapter 8, vol. 12, pp. 408–412.

D. J. Bartelink, "The Transpacitor, A Novel Three–Terminal MOS–Capacitor Switching Device", IEEE Electron Device Letters, vol. EDL–3, No. 7, Jul., 1982, pp. 198–200.

Takahiro Hanyu and Tstsuo Higuchi, "Design of a Highly Parallel AI Processor Using New Multple–Valuied MOS Devices", IEEE Proceedings, The Eighteenth International Symposium on Multiple–Valued Logic, May 4–26, 1988, Palma de Mallorca, Spain.

*Primary Examiner*—Mahshid D. Saadat
*Assistant Examiner*—Nathan K. Kelley
*Attorney, Agent, or Firm*—Denise A. Lee

[57] ABSTRACT

The present invention provides a digital vertical multi-valued logic device including a substrate defining a horizontal plane and a vertical direction normal to the horizontal plane, a substantially vertical conductive gate structure disposed above the substrate, source and drain regions, a channel region positioned between the source and drain region and adjacent to the gate structure, the channel region including at least a first and second tunnel barrier forming a quantum well structure. The quantum well acts to incorporate an artificial bandstructure into the present invention modifying device performance. By introducing quantum wells into the device structure, quantum-mechanically defined drain voltage levels are introduced in the MOS transistors at which no current flows, creating stable intermediate logic levels.

19 Claims, 16 Drawing Sheets

VERTICAL CMOS DIGITAL MULTI-VALUED RESTORING LOGIC DEVICE

CROSS REFERENCE TO RELATED APPLICATION

This application is a continuation of application Ser. No. 08/400,223, filed Mar. 7, 1995, now abandoned.

BACKGROUND OF THE INVENTION

The present invention relates generally to multi-valued logic devices and more specifically to digital multi-valued integrated circuit logic devices.

Three factors limiting improved performance of integrated circuit devices are: (1) the non-scalability of the threshold voltage, (2) limitations imposed by the resistive losses of fine pitch wiring, and (3) the power dissipation associated with interconnect parasitic capacitance especially at high frequencies. Two device solutions which attempt to overcome these limitations are the vertical MOS transistor disclosed in U.S. Pat. No. 5,140,388 and analog multi-valued devices.

The minimum threshold voltage of MOS devices is a fixed voltage, determined only by the operating temperature and the desired off-state leakage. The physical channel length of a conventional device can be controlled only to within a certain tolerance determined by lithography and etching technology. Because the threshold voltage does not scale with feature size and it is desirable to operate with a reduced power supply voltage as devices are scaled, the control margin on the channel length becomes increasingly important. The vertical MOS transistor discussed in U.S. Pat. No. 5,140,388 offers improved channel length control compared to conventional integrated circuit devices since the use of blanket epitaxy provides for accurate control of the physical channel length of the device, potentially to atomic layer precision through atomic layer epitaxy (ALE). Nevertheless, the subthreshold turnoff of the conventional MOSFET is not improved. Additional non-linearities in the transistor characteristics are needed to make a fundamental improvement. Quantum devices hold the promise of such non-linear behavior.

To overcome resistance limitations imposed by fine pitch wiring, multiple levels of interconnects and connecting vias are used in the interconnection of devices. However, if the number of metal levels is increased as a way of increasing wiring density while keeping the resistance low through wider wires, one clearly encounters another limit when it is contemplated how these wiring levels are to be interconnected through vias. The useful electrical function per level decreases as the number of wiring layers increases since the upper levels can only be connected very indirectly to the devices on the silicon substrate level. Multi-valued logic devices offer a solution to wiring resistance problems since multi-valued logic allows larger wiring cross-sections by sharing one wire over several logic levels. Thus the concept of using wiring with enhanced functionality through multi-valued logic avoids the via limitation while at the same time allowing larger diameter wires.

Multi-valued logic allows each wire to have a higher information density requiring fewer wires for equivalent functionality. Because the wiring density can be achieved with fewer wires, thus allowing larger, lower resistance wires, the parasitic capacitance can also be cut by increasing the spacing. This is true in view of the trade-off between "ground-plane capacitance" and "cross-talk capacitance" that must be made for signal integrity. Normally, as the wiring pitch becomes tighter, mutual capacitance must be offset with a closer spacing of the ground plane. This has the deleterious effect of increasing the total line capacitance per unit length. Thus, using the multi-valued logic for higher information density allows the wires to be made with superior properties.

Limiting power dissipation is becoming increasing important, especially in view of the growing importance of portable products. A common solution to decreasing power dissipation is lowering the signal swing. Reducing the power supply voltage in conventional CMOS reduces the signal swing and thus is very attractive, assuming that noise margins and process control margins are acceptable. Multi-valued logic, by its nature, implies reduction in signal swing and a power savings.

A new mode of power saving results from power dissipation associated with the threshold voltage. Since in conventional single-level logic, the useful drive of the load occurs only for the voltage above the voltage threshold of the device, a low supply voltage gives a reduced ratio of useful to parasitic power, i.e. the power used in bringing the input voltage to the threshold represents a large fraction of the input power. In multi-valued logic this threshold power is shared by more than one possible logic state and is therefore effectively reduced.

Although multi-valued logic circuits offer solutions to the problems associated with resistive losses of fine pitch wiring and power dissipation, multi-valued logic devices used to date tend to be analog devices which are connected together to operate as an analog circuit. Currently existing multi-valued logic device concepts, being analog in nature, require improvements in process control that cannot be delivered cost-effectively for digital applications. Quantum devices, moreover, are problematic for room temperature operation even in the best materials. For silicon based technology to work at normal operating conditions, there will have to be major advances over current practice.

A digital multi-valued logic device capable of room temperature operation which minimizes the problems resulting from threshold voltage scaling, wiring density, and power dissipation is needed.

SUMMARY OF THE INVENTION

In accordance with the present invention, a digital multi-valued logic device which minimizes the problems associated with threshold voltage scaling, wiring density, and power dissipation due to parasitic capacitance is provided. The multi-valued logic device is a vertical MOS transistor similar in structure to the vertical MOS transistor described in U.S. Pat. No. 5,140,388. However, in contrast to the disclosed vertical MOS transistor, the present invention includes two or more tunnel barriers in the channel region of the MOS transistor. These tunnel barriers act together to produce quantum wells which incorporate an artificial band-structure into the devices of the present invention modifying device performance.

By introducing quantum well structures into the device channel, quantum-mechanically defined drain voltage levels are introduced in the MOS transistors at which reduced current flows by quantum interference, creating stable intermediate circuit voltages. The intermediate voltage levels act as digital logic levels to which the circuit is "restored" after the inherently analog operation of combinatorial electrical function has left the voltage level uncertain. This is in contrast to conventional restoring logic devices which only restore the signal levels to two values: power supply and ground.

The preferred embodiment of the present invention configures first and second MOS vertical quantum transistors having different conductivity types into a CMOS inverter. The CMOS inverter is built upon a substrate, where the substrate defines a horizontal plane and a vertical direction normal to the horizontal plane. The vertical quantum transistors have vertical current flow positioned along the vertical sidewall of a trench etched into the substrate. Each MOS vertical quantum transistor is comprised of a substantially vertical conductive gate structure disposed above the substrate, source and drain regions, a channel region positioned between the source and drain region and adjacent to the gate structure, the channel region including at least a first and second tunnel barrier. Typically, the channel region surrounds the vertical gate structure.

In quiescent operation, the MOS vertical transistors are in a low conduction state at power or ground potential. In active operation, the transistors are in in-between states that are part of the active or dynamic operation and their power dissipation should be compared with the $CV^2f$ power already being expended in propagating a signal to the next stage not to the standby or quiescent power. The power savings come from reducing the signal swing, although the active DC conduction must be minimized by suitable design of the transistor characteristics.

In the preferred embodiment, the quantum mechanically defined well levels are formed by the process of depositing first and second SiGe strained layers by atomic layer epitaxy, etching the strained layers selectively, with a strain dependent etch, over a predetermined distance outward from the trench, and oxidizing the etched voids to form silicon dioxide layers. These oxide layers form the quantum mechanical tunnel barriers to the vertical current flow which gives rise to resonant tunneling behavior. By masking the strain dependent etch using a photolithographic process, conventional and quantum transistors can be made in the same circuit.

The vertical CMOS structure works well because the vertical current flow direction is orthogonal to the normal epitaxial planes. The stacking of MOS transistors to make a CMOS inverter makes blanket epitaxy of the starting wafer possible, whereby the complex and expensive tooling of the atomic layer epitaxy can be concentrated at a large dedicated fabrication facility and not be required at each circuit manufacturing site.

The major increase in process complexity over U.S. Pat. No. 5,140,388 is through the incorporation of fine epitaxial layers in the starting material. The quantum levels introduced would be of fundamental accuracy by depending only on the selection of atomic species and their deposition, with digital precision using atomic layer epitaxy. These levels would then be universal through the industry allowing chips from different vendors could talk to each other. The mask personalization of a specific design would start after significant device structure is already incorporated in the wafer. This not only saves on process complexity for the chip maker but also reduces the cycle time.

A further understanding of the nature and advantages of the present invention may be realized with reference to the remaining portions of the specification and the attached drawings.

DESCRIPTION OF THE PREFERRED EMBODIMENTS OF THE INVENTION

Figure 1:
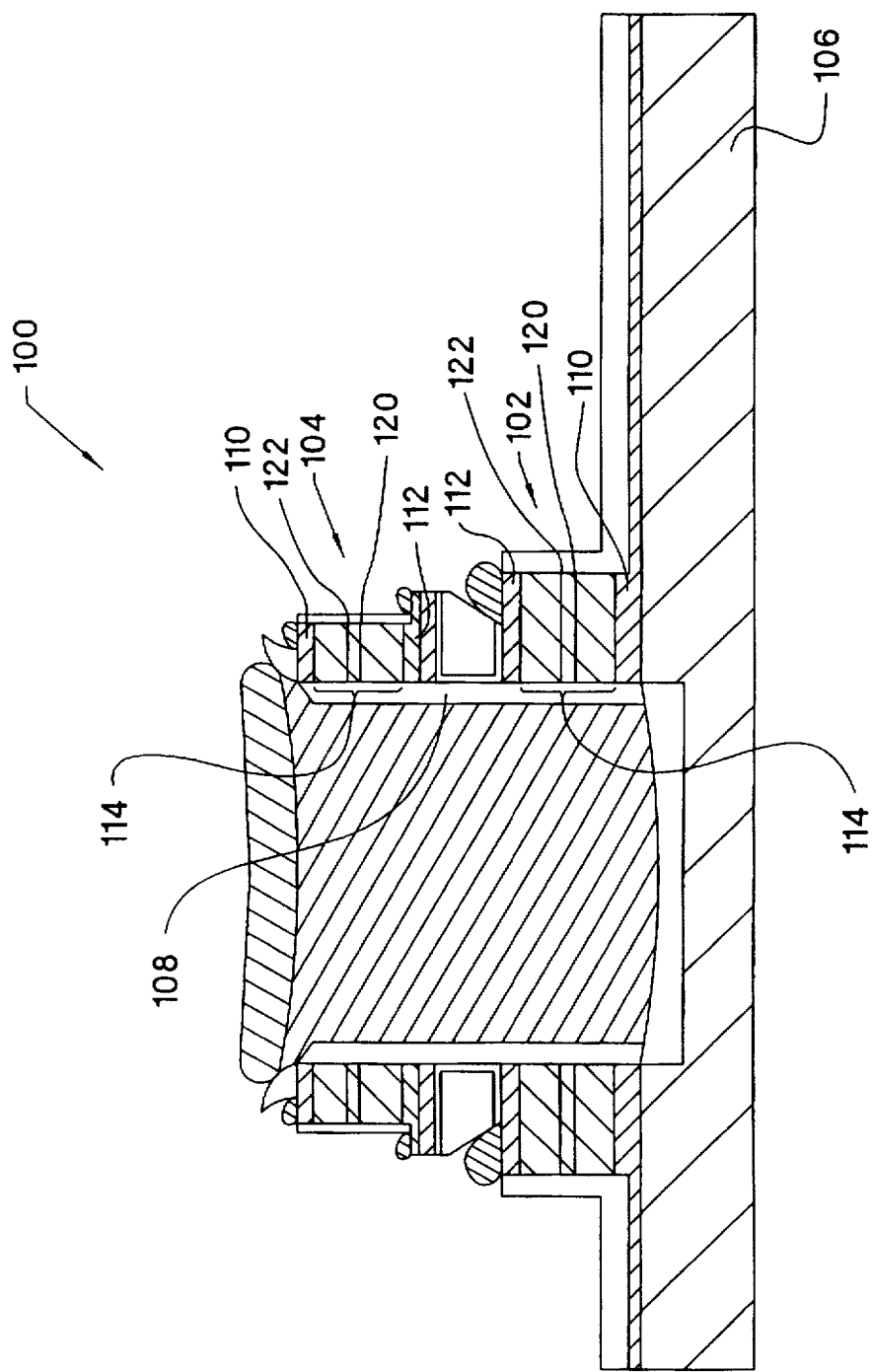
FIG. 1 shows a cross-sectional view of a pair of vertical multi-valued quantum devices according to the present invention configured in a CMOS inverter.

Reference to FIG. 1 shows a cross-sectional view of a pair of vertical multi-valued quantum devices according to the present invention configured as a CMOS inverter 100. In the preferred embodiment, first and second MOS vertical multi-valued quantum devices 102, 104 having different conductivity types, are configured as a CMOS inverter 100. The first vertical multi-valued quantum transistor 102 is built on a substrate 106. The substrate 106 defines a horizontal plane and a vertical direction normal to the horizontal plane. Each vertical transistor includes a substantially vertical conductive gate structure 108 disposed above the substrate 106. In the CMOS inverter shown, the gate structure 108 is shared by both MOS transistors 102 and 104. Each MOS transistor further includes a source and a drain region 110, 112 and a channel region 114. The channel region 114 is positioned between the source and drain regions 110, 112 adjacent to the gate structure 108. The channel region 114 including a first tunnel barrier 120 and a second tunnel barrier 122 which together act to form a quantum well.

The process flow for formation of the CMOS multi-valued restoring logic device according to the present invention is similar to the processes described in U.S. Pat. No. 5,140,388 which is incorporated by reference. However, in addition to the steps described in U.S. Pat. No. 5,140,388, tunnel barriers are formed in the inversion channel of each MOS vertical device.

Figure 2A:
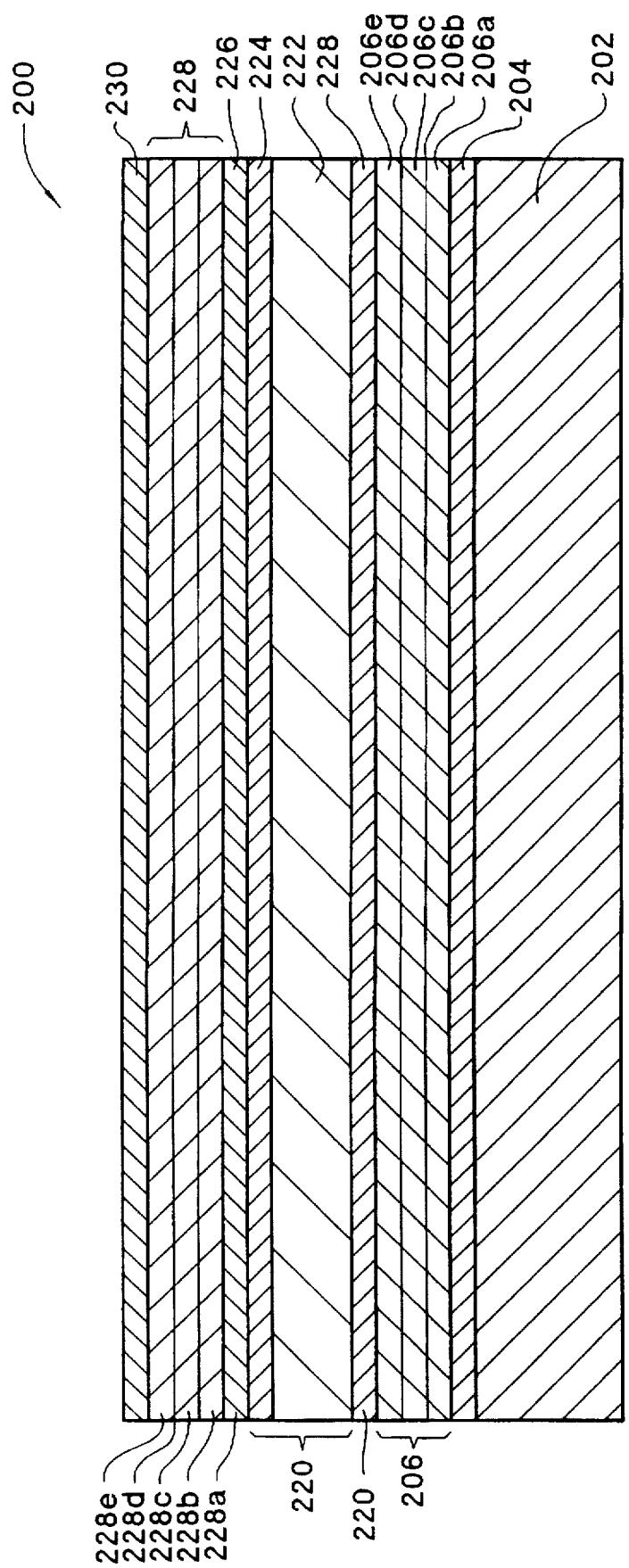
FIGS. 2A–2F show a cross-sectional view of the fabrication sequence of a digital multi-valued CMOS logic device according to the present invention.

In accordance with the present invention, a method for fabricating a multi-valued logic device according to the present invention is illustrated in FIGS. 2A–2F. FIG. 2A represents a step for the formation of a multi-valued device according to the preferred embodiment of the present invention and reveals a cross-sectional view of a series of alternately doped semiconductor layers.

The first p+ layer 202 is a relatively thick silicon layer and forms the structural substrate for the circuit components to be constructed. Next, a series of semiconductor layers are epitaxially deposited on top of the substrate p+ layer 202. First, a thin p+ layer 204 (~30 nm) is formed on the substrate. In the embodiment shown in FIG. 2, the p+ layer 204 functions as the source region of the MOS transistor. Of course, the p+ layer 204 may function either as the source or drain of the MOS device, depending upon the eventual circuit connection. For this reason, the semiconductor layers located on either side of the channel region will be termed the source/drain layer for the remainder of this description.

Next, the channel 206 between the p+source/drain layers 204, 208 is formed. Unlike channel layers 16 and 28 shown in FIG. 1 of U.S. Pat. No. 5,140,388 which are comprised of a single semiconductor layer having the same dopant concentration, the channel layer 206 in FIG. 2 is comprised of a plurality of layers. The channel layer 206 is comprised of a first layer 206a, a second layer 206b, a third layer 206c, a fourth layer 206d and a fifth layer 206e. The first layer 206a, third layer 206c, and fifth layer 206e are typically comprised of a semiconductor material. Typically, the layers are positioned so that the second layer 206b is positioned between the first and third layers 206a, 206c and the fourth layer 206d is positioned between the third and fifth layers 206c, 206e.

In the preferred embodiment, the first layer 206a of the channel 206 is a n layer having a thickness between 10 to 40 nm. Next, a thin layer strained layer 206b is formed. It is envisioned that the strained layer 206b would be formed by a fractional coverage of Ge atoms in a monolayer or a few-atom layer that would stretch the bonds of the whole layer. It is believed that the stretched bonds of the strained layer 206b can be the object of a selective etchant applied in a future step. After formation of the strained layer 206b, a second n layer 206c is formed on the surface of the strained layer 206b. The thickness of layer 206c is believed to be the most critical value and having a thickness in the range of 3–10 nm, it determines the energy levels of the multi-valued quantum device. Following formation of layer 206c, a second strained layer 206d is formed. Next, a third layer 206e of n material is formed on the second strained layer 206d. The total thickness of channel layer 206 is 100–200 nm corresponding to the channel length of conventional CMOS technology of the 0.18 to 0.13 micron generations. After formation of the channel layer 206, a p+source/drain layer 208 preferably having a thickness in the range of 30 to 60 nm is formed.

After formation of the source/drain layer 208, a separating region 220 comprised of n layer 222 and p+ layer 224 are formed. The two layers 222 and 224 are used to separate the two vertical transistors from one another and are useful for several of the subsequent processing steps. After formation of the separating region 220, a second vertical multi-valued quantum transistor is formed following a similar sequence as the previous transistor, yet having a different conductivity type to form a CMOS type inverter. In the embodiment shown in FIG. 2A, the substrate layer 202 and the source/drain layer 204 are both of a p+ type semiconductor material, but this is not necessary and various other combinations, are possible including having separate layers in different positions, for example, below the PMOS device. In addition, the substrate may serve as a power supply connection VDD to the circuitry.

The steps for formation of the second vertical MOS device includes the steps of forming a thin n+ layer 226 (~30 nm) on the uppermost layer of the substrate. Next, the channel 228 between the n+ source/drain layers 226, 230 is formed. The sequence of layers forming the channel 228 is as follows: a first p layer 228a (~50 to 150 nm in thickness), a thin layer strained layer 228b, a second p layer 228c is formed on the surface of the strained layer 228b followed by formation of a second strained layer 228d formed on the surface of the n+ layer 228c, and formation of a third player 228e. Channel 228, having a thickness of 100 to 200 nm and a critical positioning of the strained layers with it, must be an appropriate match to channel layers 206 to obtain matched CMOS operation. After formation of the third p layer 228e, the n+ source/drain region 230 is formed.

Figure 2B:
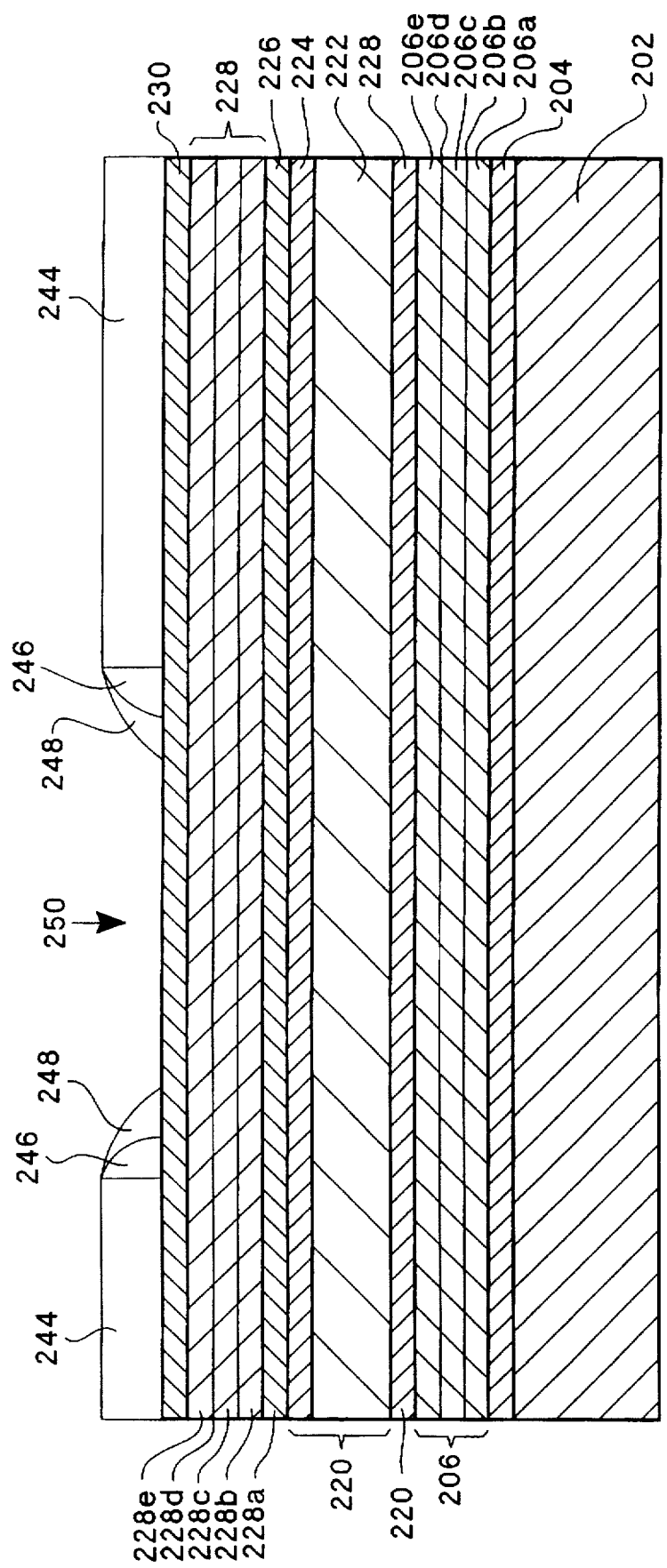
Figure 2C:
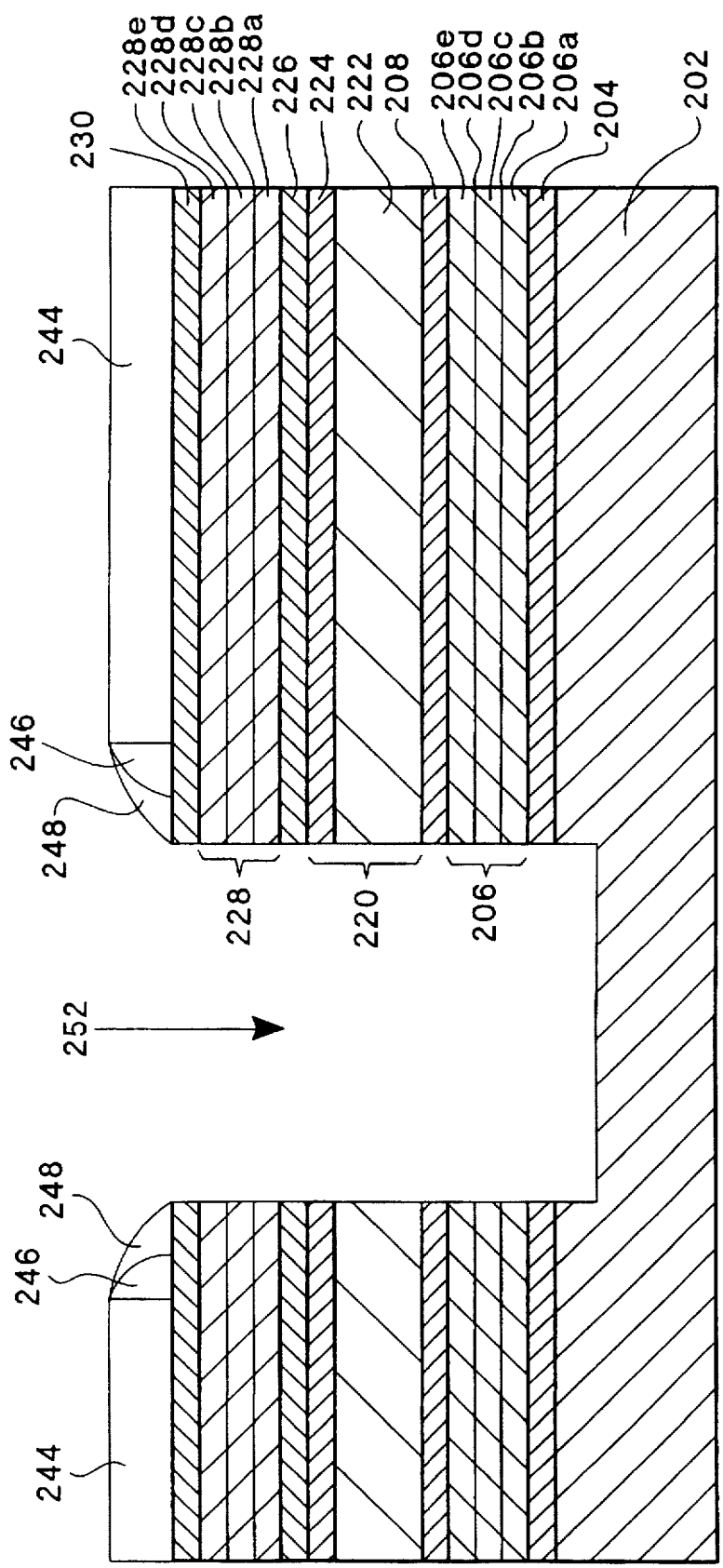
Figure 2D:
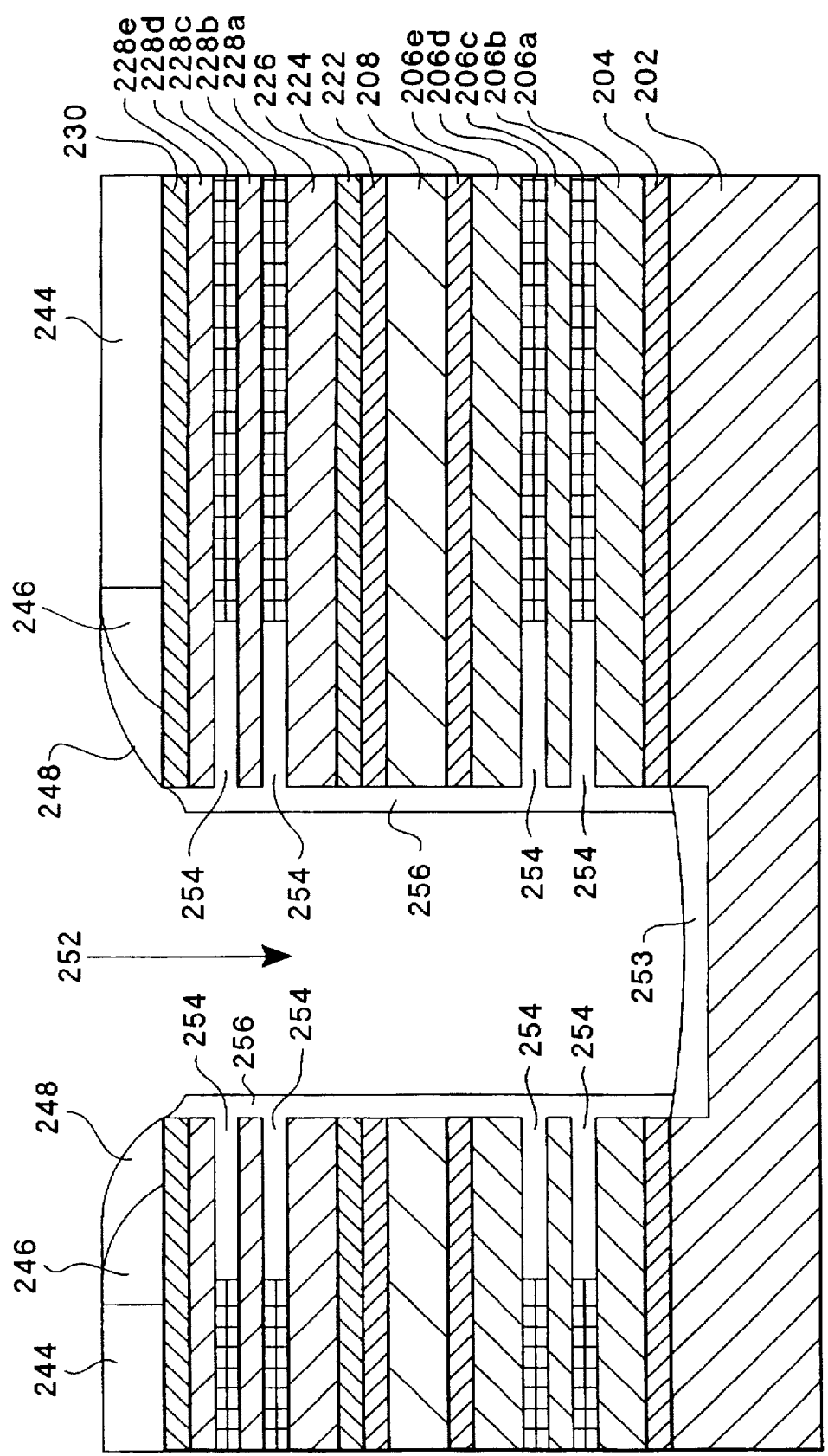

After formation of the source, drain and channel layers of the CMOS inverter, a trench is formed in the semiconductor layers for gate formation. Referring to FIG. 2B, shows an oxide layer 244, a nitride spacer 246, and an oxide spacer 248 used as a mask for gate formation. Referring to FIG. 2C, using the oxide layer 244, nitride spacer 246, and oxide spacer 248 as a mask, a hole is cut through the aperture 250, all the way through epitaxially deposited layers and into the substrate 202 as illustrated in FIG. 2C. Any anisotropic etching process may be employed to cut hole 252. Using electron cyclotron resonance deposition (ECR), or other similar anisotropic deposition techniques, the bottom portion of the hole is filled with an oxide deposit 253 to approximately a depth of about 0.11 um, depending on the depth of the etch, so that its top aligns closely with the top of the substrate layer 202 as can be seen in FIG. 2D. The sidewalls of the hole are cleared of all materials, such as all oxides.

FIG. 2D shows a cross-sectional view of the process sequence after the steps of (1) formation of the quantum well or tunnel barrier structures and (2) oxidation of the sidewalls of the hole 252. In FIGS. 2A–2C and FIGS. 2E–2F, the strained layers 206b, 206d, 228b, 228d are represented as a line, since the thickness of the intermediate layers 206a, 206c, 206e, 228a, 228c, 228e of the channel are much thicker than the strained monolayers. In contrast, in FIG. 2D the width of the quantum well structures are expanded to more clearly show the etching and the oxidation of strained layers 206b, 206d, 228b, 228d. Thus, in FIG. 2D the width of the strained layers 206b, 206d, 228b, 228d compared to the width of the intermediate layers 206a, 206c, 206e, 228a, 228c, 228e is clearly not to scale. Also the etch depth of the strained layers 206b, 206d, 228b, 228d is not to scale.

After the trench formation shown in FIG. 2C, an etchant is such as $NH_4OH:H_2O_2:H_2O$ is applied to remove at least a portion of the strained layers 206b, 206d, 228b, 228d. Referring to FIG. 2D, the strained layers 206b, 206d, 228b, 228d are comprised of a material (SiGe) having a different etch rate than the material from which the intermediate layers 206a, 206c, 206e, 228a, 228c, 228e are formed. Since the strained layers has a much higher etch rate when exposed to etchant $NH_4OH:H_2O_2:H_2O$, the intermediate channel layers 206a, 206c, 206e, 228a, 228c, 228e remain. In the embodiment shown in FIG. 2D, the etchant is not allowed to remove the strained layer across the entire width of the strained layer, but instead removes only a portion of the strained layer.

In one embodiment, the step of etching to remove a portion of the strained layers is followed by an oxidation step. Alternatively by masking the strain dependent etch after the step shown in FIG. 2C using a photolithographic process, conventional and quantum transistors can be made in the same circuit. The oxidation step fills the portion of the strained layers which has been removed with an oxide to form oxide regions 254. In addition, the oxidation step forms an oxide layer 256 on the sidewalls of the hole 252. Typically the oxide regions 254 and oxide layer 256 are formed using a rapid thermal process (RTP) which grows thin high quality oxides. As familiar in the art, the oxide may be grown by raising the substrate to a carefully controlled temperature of approximately 800 to 900 degrees Celsius in an oxygen environment. RTP can raise the substrate temperature while avoiding substantial interdiffusion of the epitaxial layers.

In the present embodiment, the second and fourth tunneling 206b, 206d, 228b, 228d layers of the channel region are typically comprised of $SiO_2$, while the first, third and fifth intermediate layers 206a, 206c, 206e, 228a, 228c, 228e are comprised of silicon. Using silicon and $SiO_2$ materials provides a tunnel barrier high enough for good device performance and materials control suitable for reproducible manufacturing. For room temperature operation, the tunnel barrier structure must be thin and high in order to minimize the series resistance while giving good peak-to-valley ratio in the tunnel current. Its width can be adjusted by adjusting the number of atomic layers of strained material. In resonant tunneling, the two tunnel barriers must be spaced close enough together to obtain adequate voltage separation of the allowed states relative to the thermal broadening at room temperature.

In contrast to the channel layers 16 and 26 shown in FIG. 1 of U.S. Pat. No. 5,140,388 which are comprised of a semiconductor layer having the opposite type dopant concentration but comprised of the same material, in the present invention the channel layer 206 is comprised of alternating barrier layers which have a different energy bandgap then the intermediate layers. Although in the embodiment shown in FIG. 2, two barrier layers are shown, other barrier layer configurations are possible. In one embodiment, a single tunnel barrier layer is formed in the channel 206. Alternatively, three or more tunnel barriers may be formed in the channel 206 resulting in additional types of resonant states including a superlattice.

The oxidation process needs to be highly limited to prevent the tunnel barrier from becoming too thick. A key requirement is that the thickness be well controlled on an atomic scale to produce a final thickness of around 10-15 angstroms to assure large tunneling currents in the transistor channel. Even more important is the distance between the two barriers which must be about 30 angstroms because this thickness determines the energy levels and must be highly reproducible from wafer to wafer so that circuits made from different suppliers have standard voltage levels suitable for communicating signals between them. Thus the formation of the thin oxide layers with atomic replacement from a crystal lattice is the essential element in the fabrication.

In the embodiment shown in FIG. 2D, the barrier layers are comprised of SiGe material that is replaced in later processing steps with silicon dioxide. Because the second and fourth barrier layers 206b, 206d are removed by etching before replacement it is important that the second and fourth thin layer have a different etch rate then the first, third and fifth intermediate layers. In alternative embodiment, other materials than SiGe may be used to replace the second and fourth layers, for example, dopant atoms such as phosphorous may be substituted. These replacement materials should have similar etch differential when compared to the first, third and fifth layers. Alternatively different removal processes besides etching, such as oxidation, may be used.

Further, in an alternative embodiment, a tunnel barrier layer which does not have to be removed and replaced could be used. For example, in an alternative embodiment a material such as calcium fluoride could be deposited epitaxially in place of SiGe. The material should have a large enough bandgap compared to the first, third and fifth layers to create a sufficient tunnel barrier between the materials. If a alternative material which does not need to be replaced is used, the etch step of etching the SiGe and the oxidation step could be eliminated. Mixing of conventional and quantum devices in the same wafer would not be as easy in this case as for the SiGe case.

Experience with SIMOX wafers, in which oxygen is implanted below the surface of a wafer to produce a buried layer of $Sio_2$, suggests that, under annealing, the interface between Si and $SiO_2$ tends to become quite planar much as if surface tension forces are at work. While the high temperatures of SIMOX annealing are very undesirable here and should be avoided, these same forces may dominate the atomic scale structures here, so that the lower temperatures may suffice in the anneal/oxidation process.

Figure 2E:
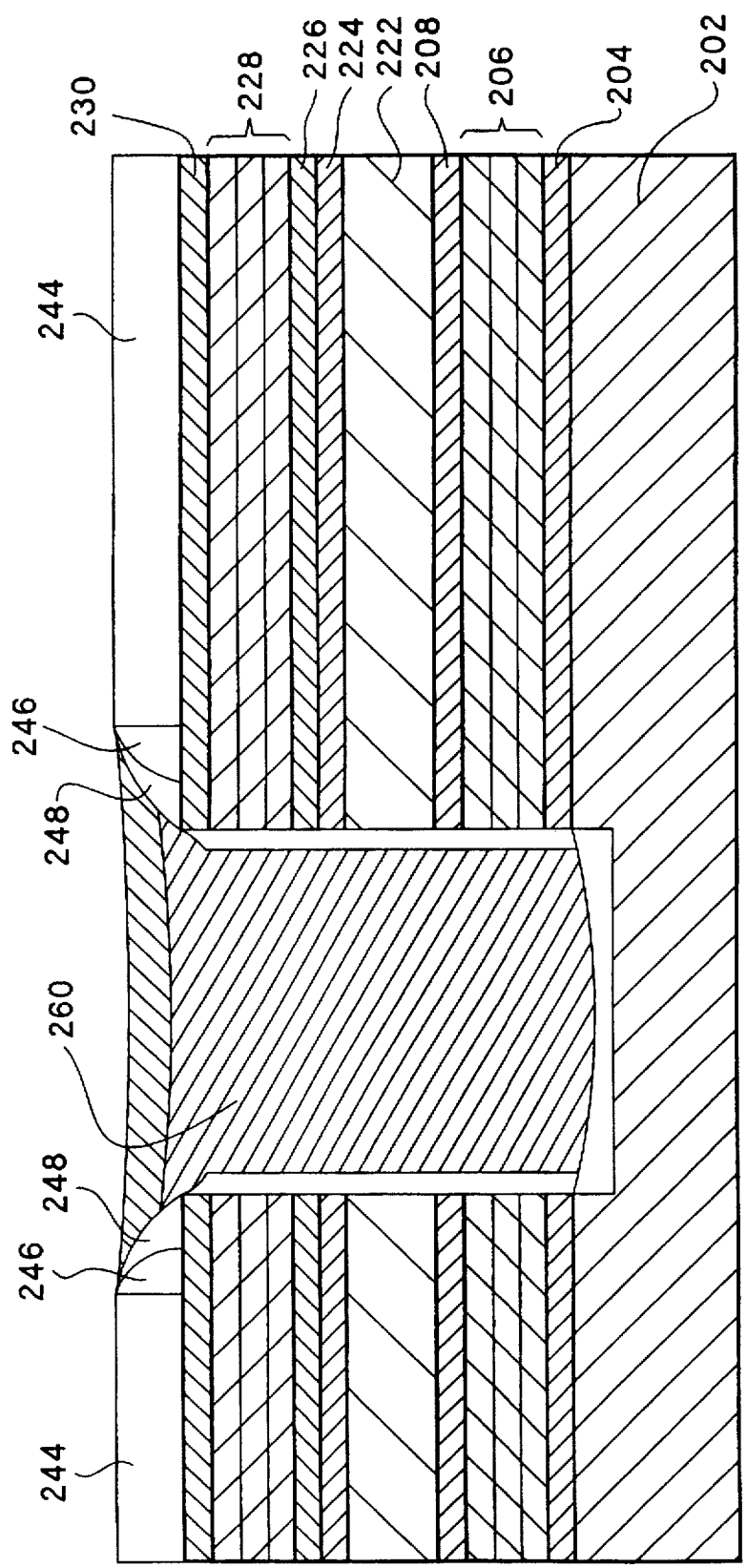
Figure 2F:
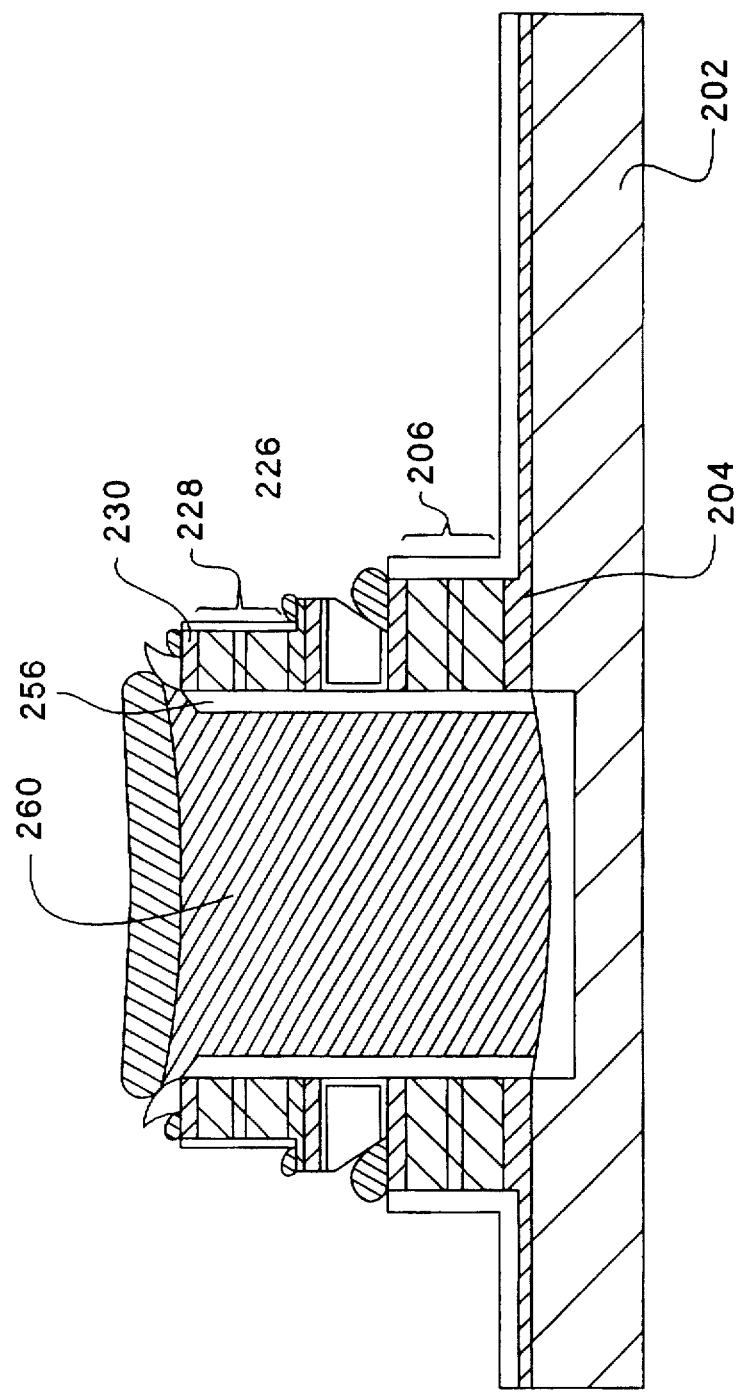

After the formation of the tunnel barriers corresponding to the oxide layers, the hole 252 is filled with doped polysilicon 260 as can be seen in FIG. 2E. The remaining steps of formation correspond to the steps in FIG. 1E-1S of U.S. Pat. No. 5,140,388 resulting in the final structure shown in FIG. 2F. FIG. 2F corresponds the vertical CMOS structure in FIG. 1.

Resonant tunneling devices fabricated from multiple quantum wells are widely studied in compound semiconductors. Under the application of a voltage, these devices show characteristic current-flow resonances when the quantum levels of adjacent quantum wells line up in energy and charge carriers can tunnel from one well to its neighbor. A succession of such quantum well energy levels can produce a set of spaced voltages for current flow. Phenomena of this type are observed at room temperature in better materials.

Figure 3A:
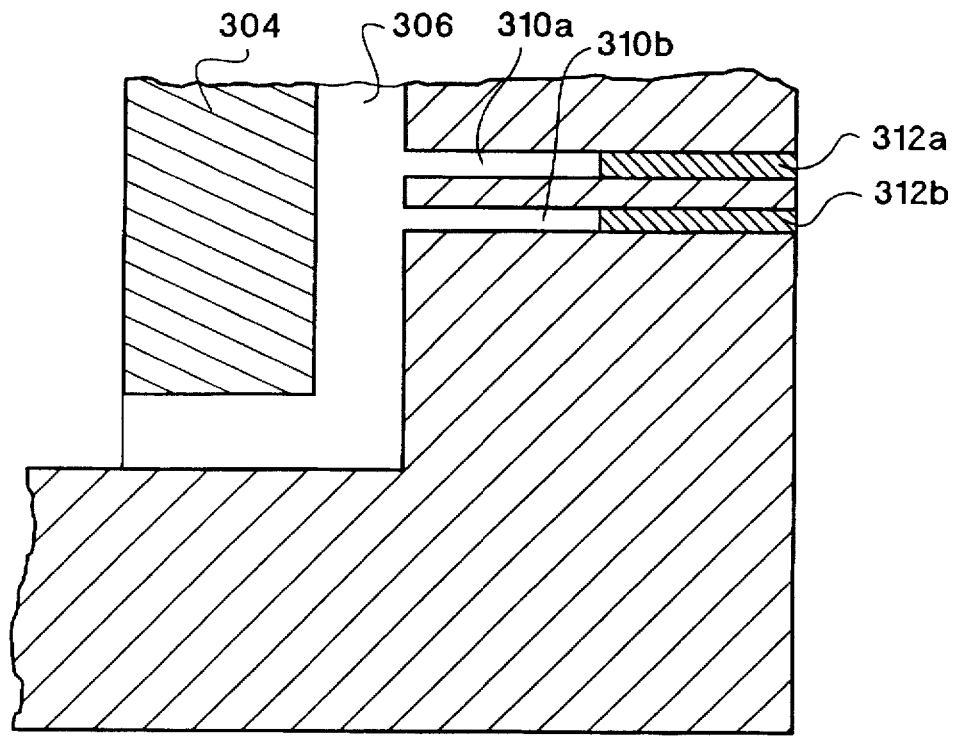
FIG. 3A shows a partial expanded view of the channel of the vertical multi-valued quantum device.

FIG. 3A shows a partial expanded view of the channel of the vertical multi-valued quantum device. Although a portion of the gate is shown, the source/drain regions of the device are not shown. Further, the device layers are not to scale. FIG. 3A shows a polysilicon region 304, and an oxide region 306 which includes a gate oxide region 308 and the oxidized portion of the quantum well structures 310a, 310b. A portion of the quantum well structures 310a, 310b are oxidized while the portion which was not previously etched 312a and 312b are SiGe.

Figure 3B:
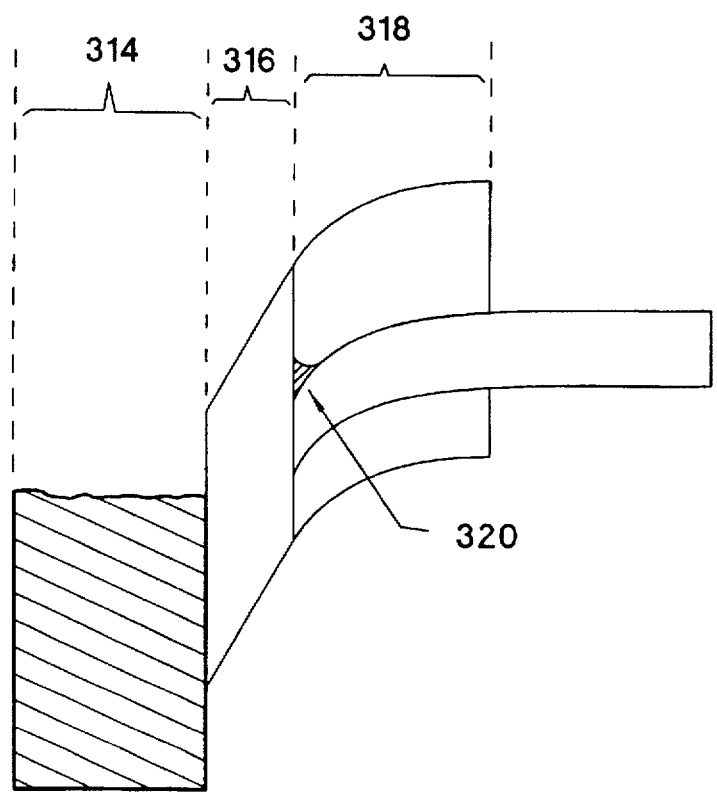
FIG. 3B shows the corresponding energy bandstructure of the expanded vertical MOS transistor shown in FIG. 3A.

FIG. 3B shows the energy bandstructure of the device corresponding to FIG. 3A. Region 314 corresponds to the energy of the polysilicon region 304. Region 316 corresponds to the energy gap of the gate oxide region 306. Region 318 corresponds to the energy bands of the oxidized portion of the quantum well structures 310a, 310b.

The novel concept introduced by the present invention is the addition of these quantum well levels to MOS transistors. The idea is to create a structure approaching a "quantum dot" with an MOS gate on its side. Referring to FIG. 3B, the darkened region 320 is representative of the "quantum dot." A quantum dot is a small pilar of quantum well layers that causes confinement of the quantum states to a small three dimensional volume. By limiting the states this way, quantum effects are easier to control for operation at room temperature. The MOS gate will serve to populate the wells with carriers when the gate voltage is appropriate but otherwise the quantum wells are affected only in a minor way since the conducting channel is very thin.

Quantum dots have been proposed as suitable sites for electronic function. These dots are usually made very small to aid in the definition of the quantum well. The vertical CMOS structure is well suited to such reduction in size since most of the processing steps are self aligned in nature. There also has been extensive work on quantum confinement in the depletion layer of MOS transistors, usually at low temperatures. These quantum effects are a confinement normal to the current flow and result from the very thin charge sheet under strong accumulation or inversion of the MOS device. In the vertical SOI device, tight confinement is induced by the thin inversion layer in one direction while the orthogonal direction can be minimized by the small width of the device.

In the current-flow direction, the quantum wells proposed here will confine the degrees of freedom of the carriers even further, basically approaching zero degrees except for tunneling. It seems to be the experience that reducing the degrees of freedom allows operation of high temperature quantum effects. It is noted that solid state structures are held together by quantum effects and these can persist to very high temperatures. We only need to tap into that same principle for almost free carriers. It is also noted that tunnel barriers of $SiO_2$ operating at room temperature are widely in use in non-volatile memories.

There has been extensive research in quantum wells in MOS transistors over many years, but these have always been with the alignment of the wells is generally parallel to the current flow direction. This is in contrast to the quantum multi-valued device described by the present invention, where alignment of the wells or tunnel barriers is generally orthogonal to the current flow direction. The assumption made here is that for a MOS transistor built as in the present invention that the quantum levels will not be strongly affected by the gate voltage except to modulate the carrier population. Thus the drain voltage controls the quantum resonance, while the gate voltage controls the concentration of carriers. The result is that the drain current continues to be a function of both the gate and drain voltage but now with a different dependence. The allowed current flow regions at "resonance" points are separated by "anti-resonances." Referring to FIG. 4B shows the current voltage characteristic of a single vertical multi-valued device and its corresponding "resonance" and "anti-resonance" regions of operation. Shown schematically in FIG. 4B are resonance regions of operation with normal drain current characteristics and blocked anti-resonances regions where no current flows.

Figure 4A:
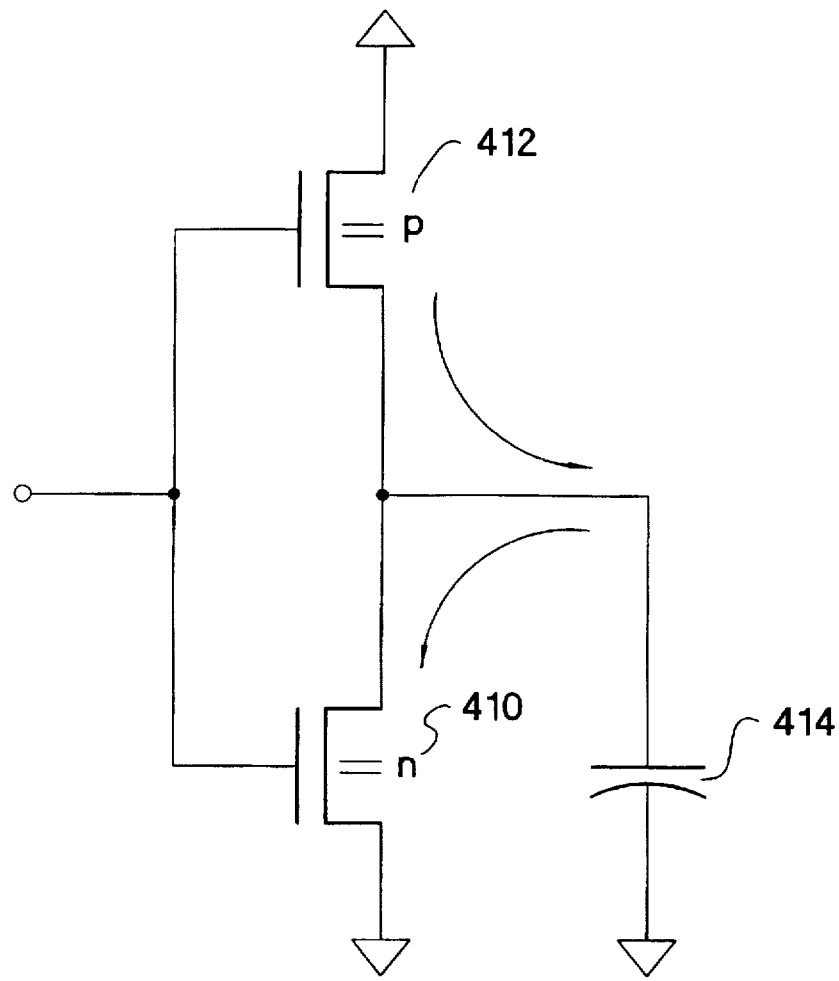
FIG. 4A shows the circuit schematic for a vertical multi-valued quantum device.
Figure 4E:
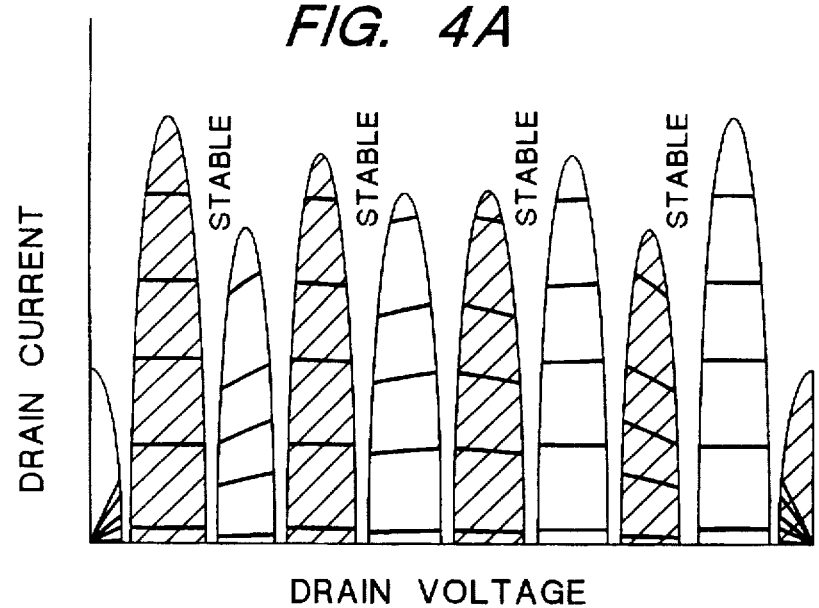
FIG. 4E shows the current-voltage characteristic for a CMOS vertical multi-valued quantum device suitable for use in memory.
Figure 4B:
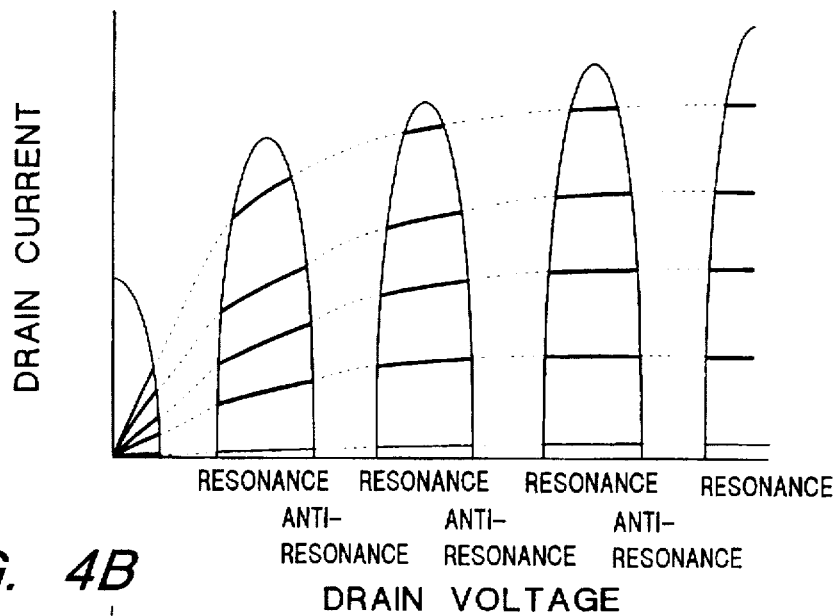
FIG. 4B shows the current voltage characteristic of a single vertical multi-valued device.
Figure 4C:
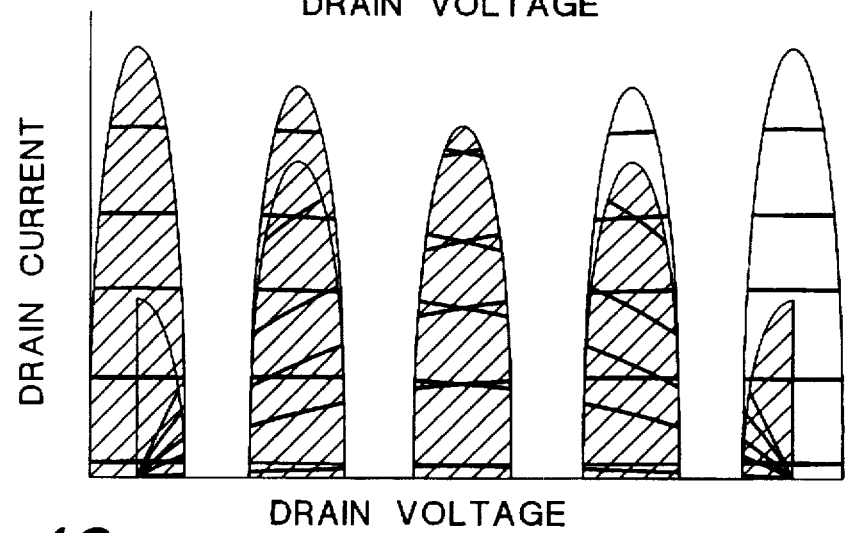
FIG. 4C shows the current-voltage characteristic for a CMOS vertical multi-valued quantum device for an in-of-phase condition.
Figure 4D:
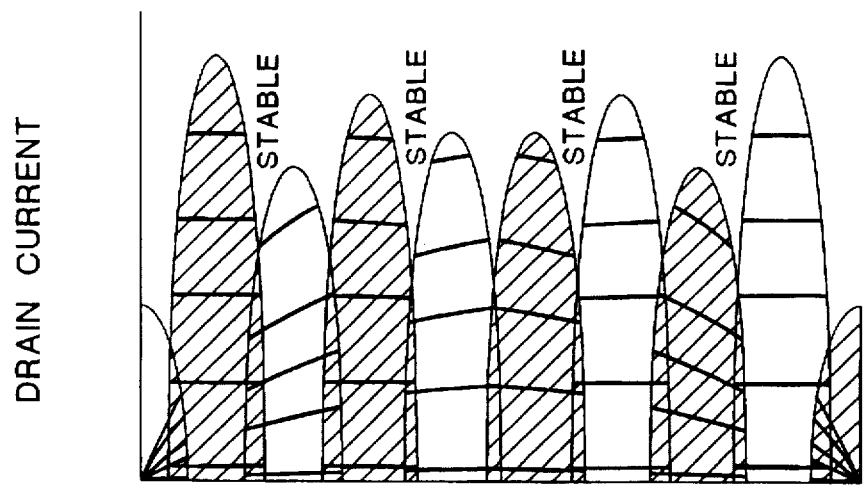
FIG. 4D shows the current-voltage characteristic for a CMOS vertical multi-valued quantum device for an out-of-phase condition.

In the quantum CMOS inverter shown in FIG. 4A, this resonance/anti-resonance effect can be put to use by having suitably matching quantum states in both the NMOS and PMOS devices. The inverter still functions much as an ordinary inverter except that current is only able to flow for certain drain voltages. The choice of power supply voltage is critical to operation. FIG. 4C and 4D illustrate schematically the two interconnection possibilities for: in-phase and out-of-phase. FIG. 4C illustrates the CMOS inverter device in-phase. FIG. 4D illustrates the CMOS inverter device out-of-phase. The in-phase condition appears to produce a situation that mimics conventional operation with some deficiencies in that certain voltages produce no current flow at all. The out-of-phase device shown in FIG. 4D has more interesting properties. It consists of two transistors that can never be on at the same time, in keeping with the conventional CMOS property that both devices are on simultaneously only during switching. For each case where current conduction of the NMOS device occurs at a higher voltage than the PMOS device (shaded), there is a stable logic level as marked on FIG. 4D. Thus, a set of stable intermediate voltage (or logic) levels within the inverter voltage swing are produced.

In operation, the out-of-phase interconnection (FIG. 4D) of the inverter of FIG. 4A and its load 414, illustrate current conduction of the NMOS and PMOS devices. If the voltage across the load is dropped below a particular logic voltage, a current in the PMOS (shaded) characteristics starts to flow to recharge the load capacitance. If the voltage is raised, the NMOS device conducts to discharge it. If the gate voltage is suddenly changed to correspond to the another logic state, say from low to high, the inverter acts much as usual.

To go beyond the schematic characteristics of FIG. 4, there must be a distinction between logic and memory operation. In memory, the main function is to achieve stable electrical states that use up little power and are disturbed only during a write operation. The characteristics of FIG. 4E, which are similar to FIG. 4D except for the narrower current spikes and thus exhibit total current blocking, are suitable for memory. Logic requires a different behavior. The key in logic is to invoke a unique relationship between the voltages on the device terminals. This will produce what can be called a causal relationship between the input and output of a stage. Thus the current cannot go all the way to zero between the logic levels otherwise it may not be possible to deviate the stage from its initial state, at least in quasi-static operation.

Figure 5A:
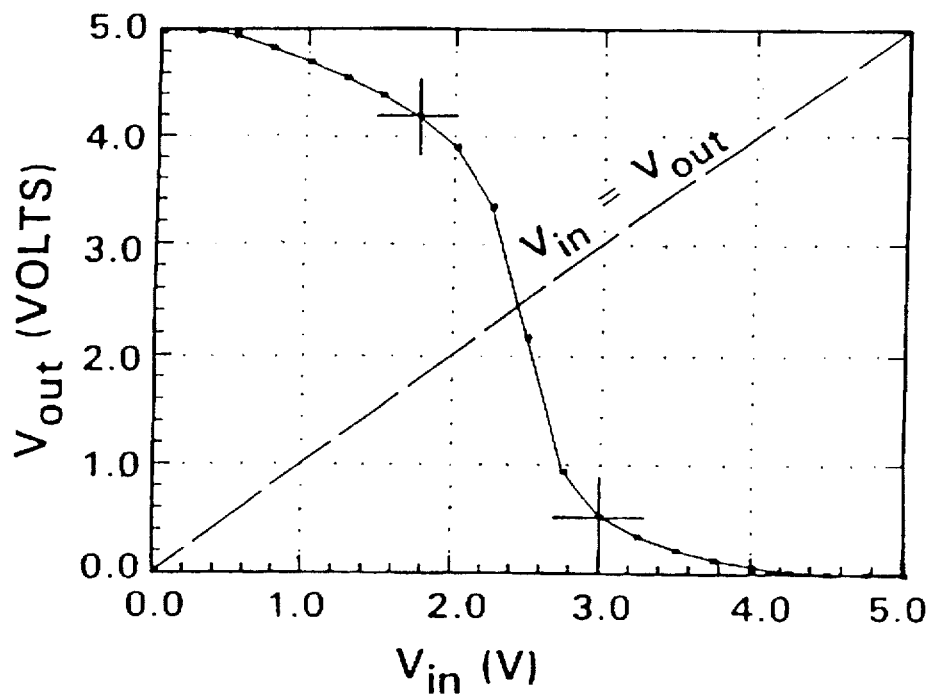
FIG. 5A shows the input/output locus of a conventional CMOS inverter.
Figure 5B:
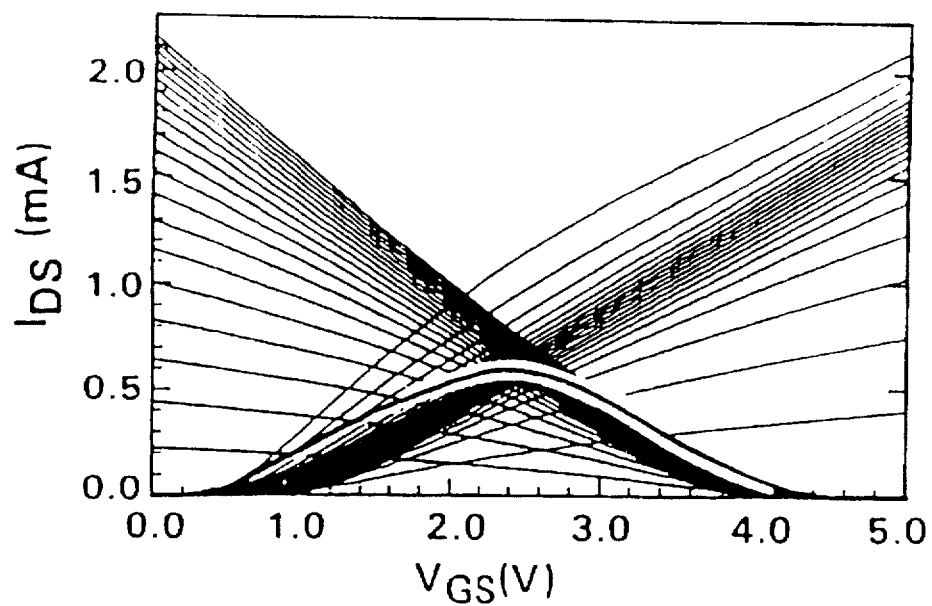
FIG. 5B shows the drain current/gate voltage characteristics of NMOS and PMOS devices in a conventional CMOS inverter.
Figure 5C:
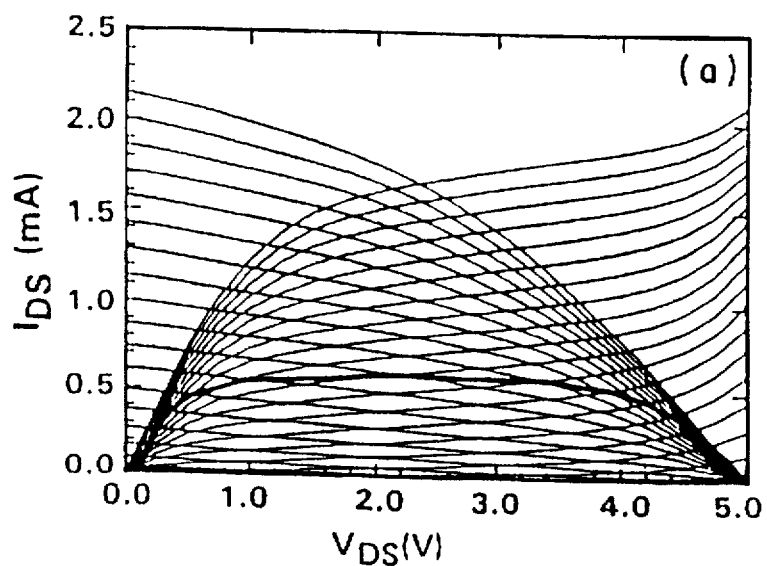
FIG. 5C shows superimposed NMOS and PMOS output voltage characteristics.

FIG. 5A shows the input/output (switching) locus of a conventional CMOS inverter, along with the drain current/ gate voltage characteristics of the NMOS and PMOS devices, in FIG. 5C. The current flow during the input/output locus is also indicated in FIG. 5C. It is well known that the inverter will switch as long as the locus has a slope steeper than −1 at the point where the input and output voltages are equal. This steeper slope in FIG. 5C can be understood from the drain current/drain voltage characteristics of the inverter shown in FIG. 5B. In FIG. 5B the NMOS and PMOS characteristics are superimposed in terms of the output voltage which they share. The output voltage has been aligned in FIGS. 5B and 5C for easy reference. The steeper slope occurs when the drain current curves of FIG. 5B are substantially constant in the region of operation along the locus. Then, for only a small change in the input voltage, the output voltage that corresponds to equal current in the two devices moves rapidly to different values. The overall S-shape of the locus derives from the other features of the drain current variation, namely where the threshold voltage occurs and where the current drops rapidly to zero at low drain voltage.

Figure 6:
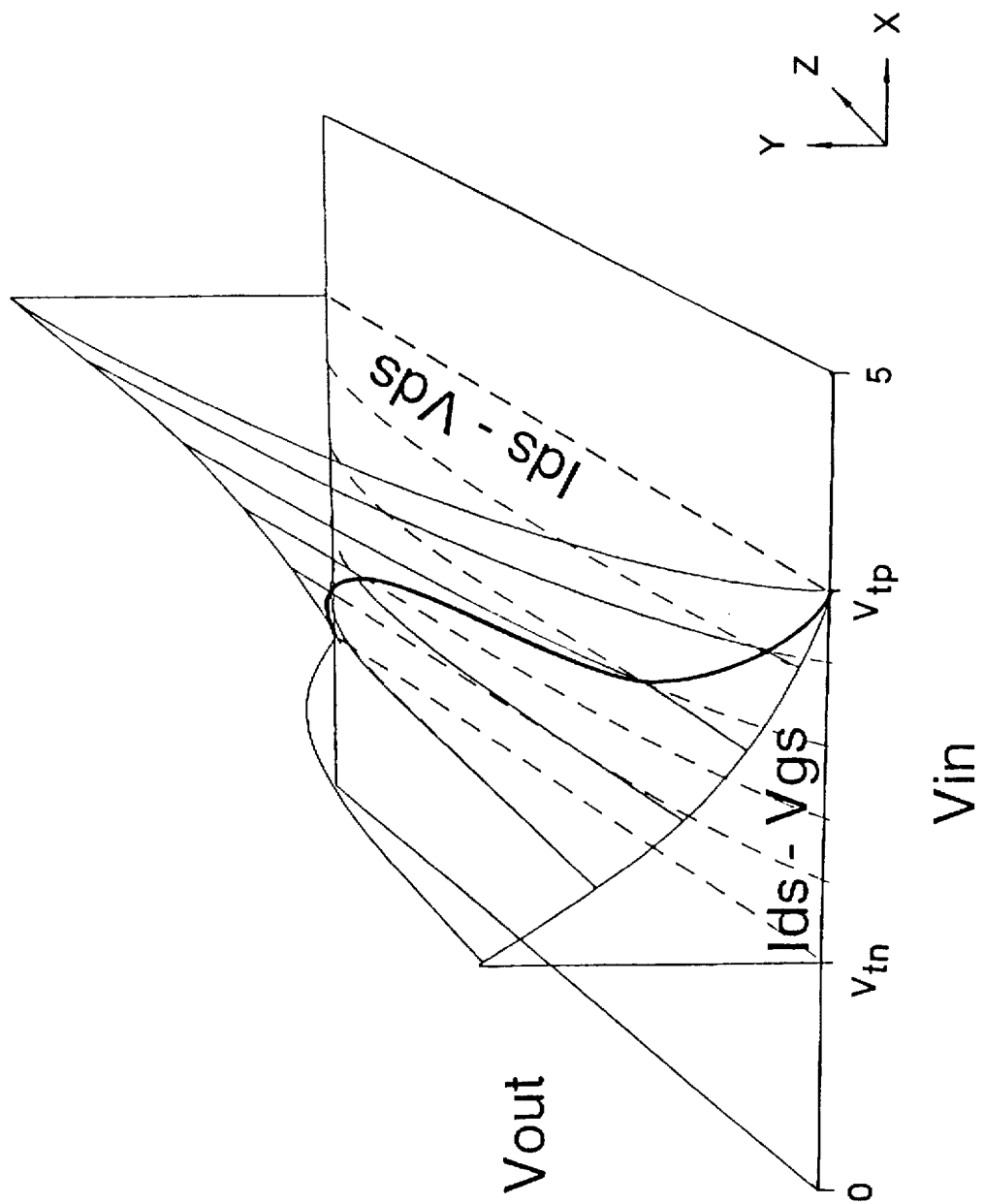
FIG. 6 shows the input/output locus of a conventional CMOS inverter.

A perspective representation of the conventional CMOS inverter input/output locus is shown in FIG. 6. It combines the widely understood "drain voltage characteristics" of FIG. 5C (yz plane of FIG. 6) and the "gate voltage characteristic" of FIG. 5B (xy plane of FIG. 6) into a three dimensional surface above the $V_{in}/V_{out}$ plane (xz plane), with a vertical scale (y axis) signifying drain current. Such a surface can be produced for both NMOS and PMOS devices, as shown in FIG. 6. The surfaces actually interpenetrate and, at their intersection, where the device currents are just equal as demanded by their circuit connection (see FIG. 5A), lies the input/output locus (heavy line). The constant gate voltage ($V_{in}$) contours are shown solid above the locus and dashed below the locus. A pronounced feature of FIG. 6 is that the surfaces do not fully cover the $V_{in}/V_{out}$ plane but end at the threshold voltages $V_{tn}$ and $V_{tp}$ for the NMOS and PMOS devices respectively. Since there is no current below threshold for one device, the other device cannot be conducting at that point, at least in static operation.

Figure 7:
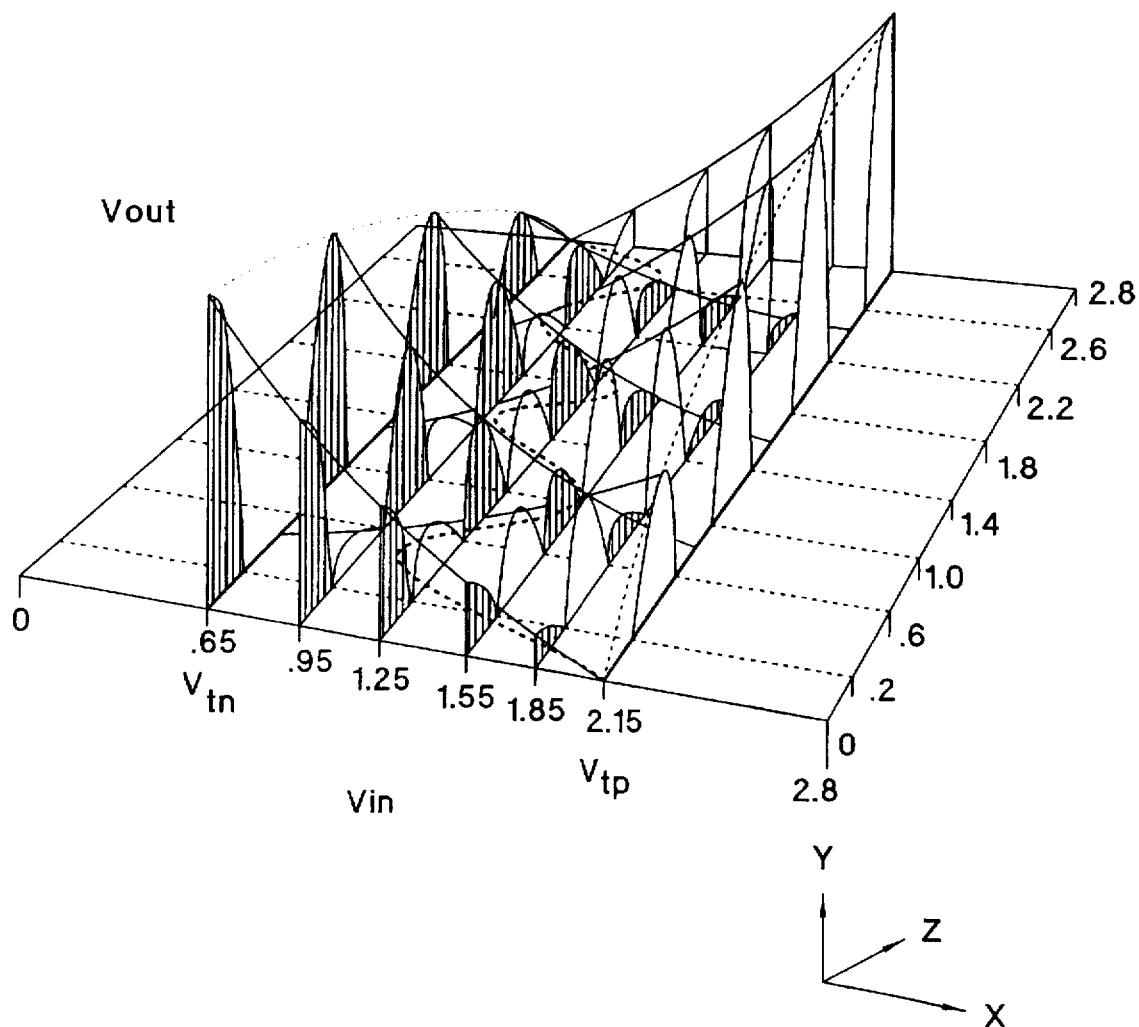
FIG. 7 shows the input/output locus of a quantum CMOS inverter according to the present invention.

The multi-valued logic operation, with devices having drain current characteristics modified by resonant tunneling, can be understood in an analogous manner to the inverter of FIG. 6. FIG. 7 shows a corresponding input/output locus that contains three smaller S-shaped replicas of FIG. 6. The overall switching locus follows roughly the locus of FIG. 6 except for specific superimposed variations.

To understand this new locus in more detail, FIG. 7 schematically presents the inverter characteristics for quantum CMOS. They replace those of FIG. 6 and have been modulated by the quantum interference effects expected for the resonant tunneling devices. The alignment of the transitions and the relationship of the minima and maxima for the CMOS devices are similar to those of FIG. 4D. Since the resonances are only a function of drain voltage, output voltage in FIG. 7, they form sloping horizontal bands. These bands are shown in cross-section at constant $V_{in}$, and have different shadings for the NMOS and PMOS devices. The smaller S-shaped replicas of the locus of FIG. 5A are also lined up with these resonances. They mark the place where the currents through the devices again can be made equal. In FIG. 7, however, the characteristics do not actually intersect and the switching locus is only schematic and is represented as a dashed line. The voltage values shown in FIG. 7 are only suggestive of the values that might be used. They do show that the quantum levels can exist at relatively small voltage intervals even though the normal threshold voltage is maintained at 0.65 volts.

Figure 8:
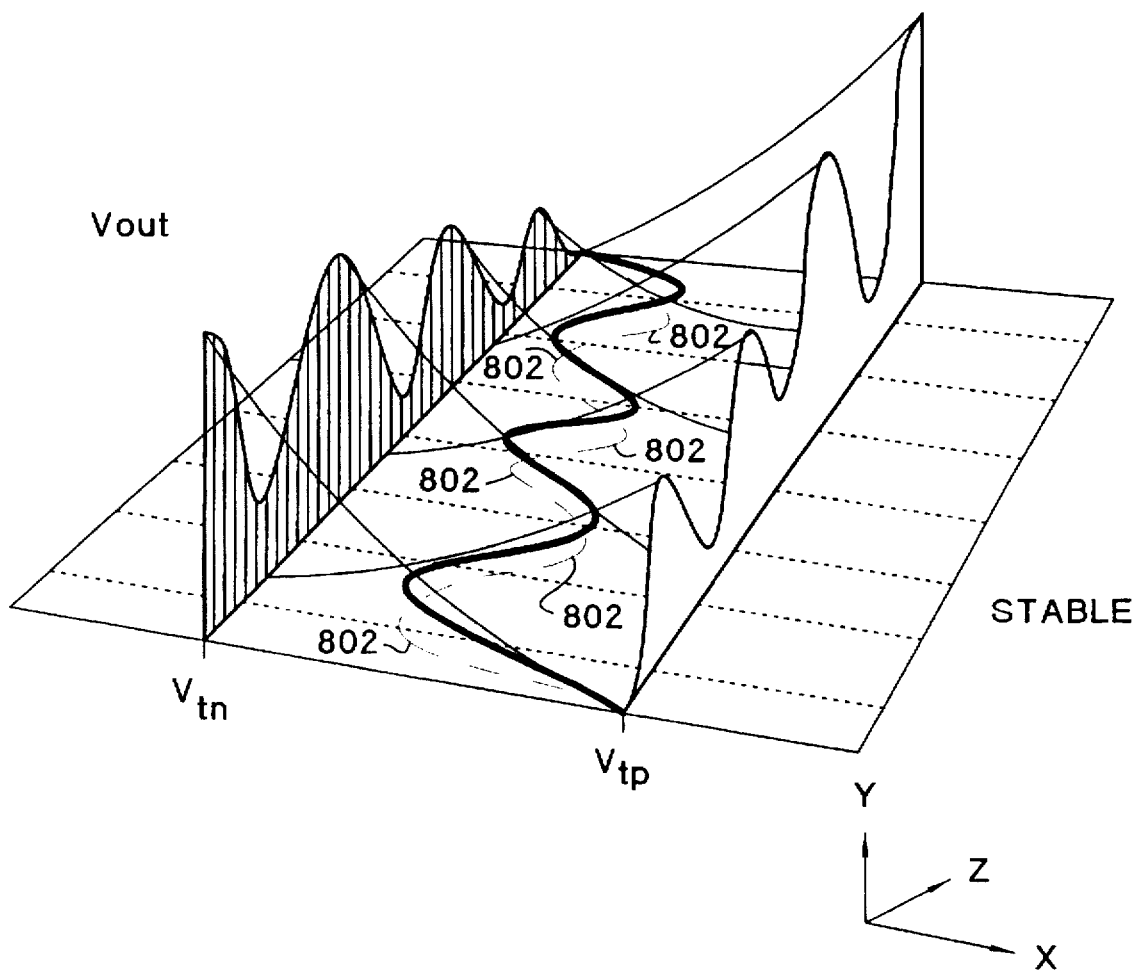
FIG. 8 shows the input/output locus of the quantum CMOS inverter corresponding to the locus of FIG. 6.

The direct equivalent of FIG. 6 is shown in FIG. 8, which differs both in representation and in the actual surfaces from FIG. 7. The surfaces are shown only by their crests and by their cross-section at the threshold voltage of the opposite device. The minima now also do not go to zero, unlike those shown in FIG. 7. The result is that the switching locus now exists for static operation, as shown by the solid heavy line, which marks the locus where the currents are equal (where the surfaces intersect).

The nature of the stable points on the locus can be understood from FIG. 8. The stable points on the locus are represented by the hatched areas between the tangents 802 of slope −1 on the projection on the base $V_{in}/V_{out}$ plane (shaded line). If the slope of the locus, as measured on its projection on the base $V_{in}/V_{out}$ plane (shaded line), is steeper than −1, there will be a transition, as in the conventional case of FIG. 5. Clearly, when the slope is positive this effect is even more pronounced. FIG. 8 also illustrates that two new stable operating points have been created near the midpoint of the inverter. In these regions, a portion of the locus has a slope less steep than the required value of −1. Thus application of a midvalue $V_{in}$ will force the inverter into that state. Additional states can likewise be created with additional quantum levels.

The number of logic levels can be increased from two to multiple levels. While multi-valued logic is the long term goal of this invention, there may be some advantage in starting with only two levels as shown in FIG. 8 and as previously discussed. In that way, experience in processing of tunnel barriers can be gained before a commitment to multi-valued logic design needs to be made. The key advantage of this approach is in the reduction of $CV^2f$ power while at the same time excellent off-state leakage is maintained through a high value of threshold voltage (0.65 volts in FIG. 7). Early experience in multi-valued logic circuit design would then follow because, there are already four stable states available counting the power and ground rails.

Returning now to FIG. 7, it is possible to understand the distinction between logic and memory applications of the quantum inverter. FIG. 7 was drawn to simplify the appearance of the cross-sections, namely by having them go to zero along the parallel set of constant $V_{out}$ values of the dotted lines. Other surface shapes are possible, in particular narrower spikes of current, as shown in FIG. 4E. These might be produced by accurately fabricating multiple quantum wells, all with the same energy levels as in a superlattice. The benefit of such a characteristic is that the standby power dissipation of a memory array is thereby improved. This is the case because the subthreshold behavior of quantum devices operating at room temperature is still no better than the 60mV/decade of the best CMOS devices. Thus, there must be sufficient room between the current conduction surface intersections with the zero current plane. The operating voltage of a memory device would therefore be chosen greater than for a logic device. In logic devices, signal swing must be kept low for minimizing power dissipation and some device current must always flow in order to maintain a causal connection with the input (as previously noted). An exception to this rigid requirement is a form of dynamic CMOS logic based on FIG. 4E in which the current through the capacitive load is able to break the simple equality of current through the NMOS and PMOS devices, thus obviating the need for an overlap of the current.

Figure 9:
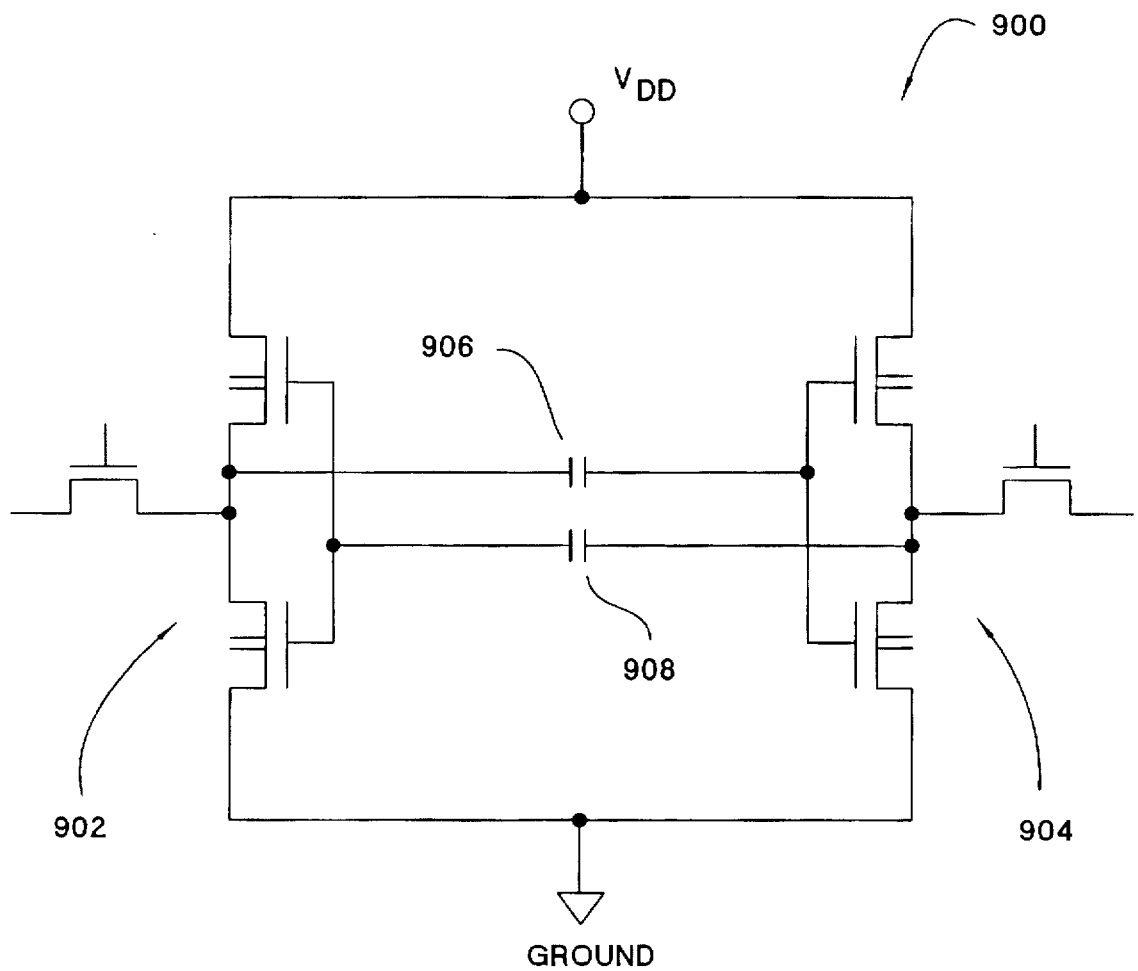
FIG. 9 shows a multi-valued logic memory cell according to the present invention.

A multi-valued memory cell 900 can be formed from two quantum CMOS inverters 902, 904 with a cross-coupling connection similar to that of a convention CMOS static RAM cell. FIG. 9 shows such a connection in which capacitors 906, 908 have been placed in the cross-coupling connections. These capacitors 906, 908 form a voltage divider network in conjunction with the gate oxide capacitors of the inverters. This divider action is used to adjust the magnitude of the voltage steps on the output of the inverter which are larger than those required by the input. The voltage scales of FIG. 7 make it clear that the threshold voltages of the NMOS and PMOS devices offset the inverter input values and compress them into a narrower range than the output. By suitable choice of capacitor values, the voltage levels can be lined up between the successive stages of logic or, as in this case, between the inverters of the memory cell.

It is understood that the above description is intended to be illustrative and not restrictive. Although the description focuses on a CMOS inverter comprising two MOS multi-valued logic transistors, the present invention may be adapted to a wide variety of circuit designs. Each different circuit embodiment depends only upon how the individual connections are formed between each transistor layer. For example, one transistor of the vertical pair may remain unconnected, using only one of the vertical transistors from each gate post. The scope of the invention should therefore not be determined with reference to the above description, but instead should be determined with reference to the appended claims, along with the full scope of the equivalents to which such claims are entitled.

What is claimed is:

1. A quantum inverter circuit with three stable output states, the quantum inverter circuit, comprising:

an input;

an output;

a first transistor comprising:

a first gate, coupled to the input, a first source region, and a first drain region, coupled to the output, wherein current through the first drain region depends upon voltage from the first gate to the first source region and upon voltage from the first drain region to the first source region, so that for a constant voltage from the first gate to the first source region and increasing voltage between the first drain region and the first source reason there is a first plurality of resonance regions of operation with significant current flow through the first drain region and between resonance regions of operation in the first plurality of resonance regions there is a blocked anti-resonance region with significantly reduced current flow through the first drain region; and, a second transistor comprising:

a second gate, coupled to the input, a second source region, and a second drain region, coupled to the output, wherein current through the second drain region depends upon voltage from the second gate to the second source region and upon voltage from the second drain region to the second source region, so that for a constant voltage from the second gate to the second source region and increasing voltage between the second drain region and the second source region there is a second plurality of resonance regions of operation with significant current flow through the second drain region and between resonance regions of operation in the second plurality of resonance regions there is a blocked anti-resonance region with significantly reduced current flow through the second drain region.

2. A quantum inverter circuit as in claim 1 wherein the first transistor additionally includes a first channel region between the first source region and the first drain region, the first channel region including a first tunnel barrier.

3. A quantum inverter circuit as in claim 2 wherein the second transistor additionally includes a second channel region between the second source region and the fourth source/drain, the second channel region including a second tunnel barrier.

4. A quantum inverter circuit as in claim 1 wherein the first transistor is an n-channel transistor and the second transistor is a p-channel transistor.

5. A quantum inverter circuit as in claim 1 wherein the first plurality of resonance regions of operation are out of phase with the second plurality of resonance regions of operation.

6. A quantum inverter circuit as in claim 1 wherein the quantum inverter circuit additionally has a fourth stable output state.

7. A logic circuit with three stable voltage states comprising:

a first transistor, comprising:

a first gate, a first source region, and a first drain region, wherein current through the first drain region depends upon voltage from the first gate to the first source region and upon voltage from the first drain region to the first source region, so that for a constant voltage from the first gate to the first source region and increasing voltage between the first drain region and the first source region there is a first plurality of resonance regions of operation with significant current flow through the first drain region and between resonance regions of operation in the first plurality of resonance regions there is a blocked anti-resonance region with significantly reduced current flow through the first drain region; and, a second transistor, comprising:

a second gate, a second source region, and a second drain region, the second drain region being coupled to the first drain region of the first transistor, wherein current through the second drain region depends upon voltage from the second gate to the second source region and upon voltage from the second drain region to the second source region, so that for a constant voltage from the second gate to the second source region and increasing voltage between the second drain region and the second source region there is a second plurality of resonance regions of operation with significant current flow through the second drain region and between resonance regions of operation in the second plurality of resonance regions there is a blocked anti-resonance region with significantly reduced current flow through the second drain region.

8. A logic circuit as in claim 7 wherein the first transistor additionally includes a first channel region between the first source region and the first drain region, the first channel region including a first tunnel barrier.

9. A logic circuit as in claim 8 wherein the second transistor additionally includes a second channel region between the second source region and the second drain region, the second channel region including a second tunnel barrier.

10. A logic circuit as in claim 7 wherein the first gate regions is connected to the second gate region.

11. A logic circuit as in claim 10 wherein the first transistor is an n-channel transistor and the second transistor is a p-channel transistor.

12. A logic circuit as in claim 11 wherein the first plurality of resonance regions of operation are out of phase with the second plurality of resonance regions of operation.

13. A logic circuit as in claim 7 wherein the logic circuit functions as a quantum inverter, the logic circuit additionally comprising:

an input coupled to the first gate and the second gate, and an output coupled to the first drain region and the second drain region.

14. A logic circuit as in claim 7 wherein the logic circuit functions as a memory cell which is stable at three separate voltage levels, the logic circuit additionally comprising:

a third transistor, comprising:

a third gate, a third source region, and a third drain region, wherein current through the third drain region depends upon voltage from the third gate to the third source region and upon voltage from the third drain region to the third source region, so that for a constant voltage from the third gate to the third source region and increasing voltage between the third drain region and the third source region there is a third plurality of resonance regions of operation with significant current flow through the third drain region and between resonance regions of operation in the third plurality of resonance regions there is a blocked anti-resonance region with significantly reduced current flow through the third drain region;

a fourth transistor, comprising:
  a fourth gate,
  a fourth source region, and
  a fourth drain region, wherein current through the fourth drain region depends upon voltage from the fourth gate to the fourth source region and upon voltage from the fourth drain region to the fourth source region, so that for a constant voltage from the fourth gate to the fourth source region and increasing voltage between the fourth drain region and the fourth source region there is a fourth plurality of resonance regions of operation with significant current flow through the fourth drain region and between resonance regions of operation in the fourth plurality of resonance regions there is a blocked anti-resonance region with significantly reduced current flow through the fourth drain region;
a first capacitor having a first end and a second end, the first end being coupled to the first gate and to the second gate, the second end being coupled to the third drain region and to the fourth drain region; and,
a second capacitor having a first end and a second end, the first end of the second capacitor being coupled to the third gate and to the fourth gate, the second end of the second capacitor being coupled to the first drain region and to the second drain region.

15. A logic circuit as in claim 7 wherein the logic circuit has a fourth stable logic voltage state.

16. A multi-valued logic circuit comprising:
  an input;
  an output;
  a first transistor comprising:
    a first source/drain region,
    a second source/drain region, coupled to the output,
    a first channel region including a first tunnel barrier, the first channel region being positioned between the first source/drain region and the second source/drain region;
    a first gate structure, coupled to the input; and
    a first gate dielectric between and contacting the first gate structure and the first channel region, wherein current flow between the first source/drain region and the second source/drain region is generally orthogonal to a plane of the first tunnel barrier; and,
  a second transistor comprising:
    a third source/drain region, coupled to the output,
    a fourth source/drain region,
    a second channel region including a second tunnel barrier, the second channel region positioned between the third source/drain region and the fourth source/drain region,
    a second gate structure, coupled to the input, and
    a second gate dielectric region between the second gate structure and the second channel region, wherein current flow between the third source/drain region and the fourth source/drain region is generally orthogonal to a plane of the second tunnel barrier;
  wherein the multi-valued logic circuit has a first stable operating point, a second stable operating point, and a third stable operating point, wherein the second stable operating point is an intermediate voltage value having a value between a voltage value of the first stable operating point and a voltage value of the second stable operating point, wherein responsive to changes of voltage applied to the input, the circuit transitions at the output between the first stable operating point, the second stable operating point and the third stable operating point.

17. The device recited in claim 16 wherein the first channel further includes a third tunnel barrier region.

18. The device recited in claim 16 wherein the first tunnel barrier and the third tunnel barrier form a quantum well.

19. The device recited in claim 16 wherein material from which the first tunnel barrier is formed has a different energy band structure than material from which a remaining portion of the first channel region is formed.

* * * * *